TEMPERATURE MODIFYING MEANS FOR SEMICONDUCTOR DEVICE

Filed Dec. 31, 1956 3 Sheets-Sheet 1

INVENTOR.
ROBERT W. FRITTS
BY
Seegert & Schwallbach
Att'ys

INVENTOR.
ROBERT W. FRITTS
BY
Seegert & Schwalbach
Att'ys

March 29, 1960 R. W. FRITTS 2,930,904

TEMPERATURE MODIFYING MEANS FOR SEMICONDUCTOR DEVICE

Filed Dec. 31, 1956 3 Sheets-Sheet 3

INVENTOR.
ROBERT W. FRITTS
BY
Seegert & Schwallbach
Att'ys 2,930,904

TEMPERATURE MODIFYING MEANS FOR SEMICONDUCTOR DEVICE

Robert W. Fritts, Elm Grove, Wis., assignor, by mesne assignments, to Minnesota Mining and Manufacturing Company, St. Paul, Minn., a corporation of Delaware Application December 31, 1956, Serial No. 631,569

17 Claims. (Cl. 307—88.5)

This invention relates to improvements in electrical devices and more particularly to electrical devices having temperature sensitive operating characteristics and having embodied therein novel means for maintaining the temperature of at least a portion thereof within predetermined efficient operating limits.

Certain electrical devices utilize therein an element in the form of a body of crystalline material having electrical properties which vary substantially with temperature. Two examples of this type of device are rectifiers and transistors, each utilizing semiconductor crystalline bodies in which heat is generated during normal operation. This heat, unless removed, has a marked deleterious effect on the operating characteristics of these devices, lowering the efficiency thereof to a very substantial degree. Moreover, devices of this type must be operated within well defined, relatively low temperature maximum limits in order to be operative at all.

It is a general object of the present invention to provide an improved electrical device of the aforementioned character having novel means for maintaining the temperature of the temperature sensitive crystalline element thereof within predetermined operating limits.

Another object of the invention is to provide an improved electrical device of the class described wherein the transfer of heat within the device is effected electrically by Peltier heat pumping, as distinguished from transfer by conduction, convection or radiation, the heat pumping means being operable to convert heat energy received thereby at one point to electrical energy for transfer as such to a remote point at which said energy is reconverted to and emitted as heat.

More specifically, an object of the invention is to provide an electrical device of the aforementioned type which takes the form of a semiconductor device of the type having a heat generating rectifying barrier therein, said device being characterized by its improved efficiency and its compactness by virtue of having thermoelectric heat pump means incorporated therein for removal of heat generated at said rectifying barrier.

Still another specific object of the invention is to provide a semi-conductor device of the character described wherein the thermoelectric heat pump means comprises at least one semimetallic element and may be connected in circuit with the semi-conductor device in such a manner that the thermoelectric heat pump means is energized by the same current which flows through the semiconductor device.

A further specific object of the invention is to provide an improved electrical device of the aforementioned character which is provided with enclosure means having two insulated heat conducting portions and having heat pump means comprising a pair of thermoelement means of opposite conductivity type, each operable to pump heat from the crystalline body to a separate one of said enclosure portions for emission therefrom.

Other objects and advantages of the invention will become apparent as the description proceeds, reference being had to the accompanying drawings, which, for the purposes of disclosure only, illustrate a number of forms which devices constructed in accordance with the invention may take. In the drawings.

The invention, in general, relates to electrical devices comprising a body of crystalline material having temperature sensitive operating characteristics, and two types of such devices are semiconductor transistors and semi-conductor rectifiers. As is well known in the art, a transistor may includes a body of semiconductor material of one type of conductivity having two P-N junctions, with the various regions of the device arranged in P-N-P or N-P-N order.

Figure 1:
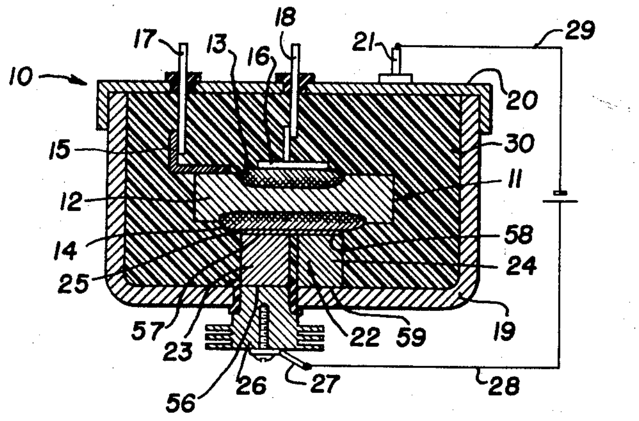
Figure 1 is a sectional view of a thermoelectrically cooled junction type transistor constructed in accordance with the teachings of the present invention.

Referring more particularly to Figure 1, the illustrated electrical device 10 includes a transistor 11 comprising a crystal or a wafer 12 of semiconductor material, for example, germanium, silicon or the like of N-type or P-type conductivity, N-type germanium being preferable. The crystal 12 is provided with a P-N junction type emitter electrode 13 and a P-N junction type collector electrode 14. The electrodes 13 and 14 include regions of a type of conductivity opposite to that of the N-type semi-conductor crystal 12, said electrodes in this case being of P-type material, separated from the crystal 12 by rectifying barriers as is well known in the art. A base electrode 15 is bonded in ohmic contact to the crystal 12, and a terminal member 16 is bonded in ohmic contact, for example, by a film of low melting point solder, to the emitter electrode 13. Electrical connections to the base electrode and to the emitter electrode are provided by leads 17 and 18 which may be spot welded or otherwise suitably connected to the base electrode 15 and terminal member 16, respectively.

The transistor 11 is provided with enclosure means which preferably takes the form of a metallic shell having good electrical and heat conductive properties comprising a cup-shaped casing member 19, an insulated contact and heat radiative member 26, and a cover member 20 electrically joined to the member 19 and provided with suitable apertures through which the electrodes 17 and 18 insulatably project as shown. As will be described in detail hereinafter, means is provided for connecting the electrode 14 in circuit with the casing member 18, and thereby to the cover member 20, the latter being provided with a collector electrode lead 21 electrically joined thereto.

Semiconductor power devices depend upon the electrical characteristics of the P-N junction regions for their operation, and the temperature of said junctions, i.e., the rectifying barriers referred to hereinbefore, and more particularly the P-N junction at the collector electrode, is raised appreciably due to $I^2R$ dissipation within the device itself during normal operation. Since the desirable electrical properties of the P-N junction regions tend to deteriorate as the temperature of the junctions increases, improved means is provided in the device 10 for removing heat from the transistor 11 through the collector electrode 14, said electrode affording means closest to the rectifying barrier at which the major portion of the heat is generated from which heat may be efficiently removed.

In the form of the invention illustrated in Figure 1 the improved means for removing heat from the transistor 11 takes the form of thermoelectric heat pump means 22 comprising dissimilar semi-metallic thermoelement means 23 and 24 bonded to a thermojunction member 25 of copper or other good electrical and heat conducting material to form thermojunctions 57 and 58. The thermojunction member 25 is bonded in good heat conducting ohmic contact, for example, by a film of low melting point solder, to the collector electrode 14. The outer end of the thermoelement means 24 is preferably bonded to the casing member 19 to form a thermojunction 59. An electrical circuit between the collector electrode 14 and the collector electrode lead 21 is completed through the thermojunction member 25, thermoelement means 24, casing member 19, and cover member 20. The thermoelement means 23 is preferably bonded to the contact and heat radiative member 26 to form a thermojunction 56. Member 26 may be provided with fins affording increased heat transfer surfaces and may also have a terminal lug 27 permitting connection of said member to a D.C. source, as by a conductor 28. The other side of the D.C. source is connected, as by a conductor 29, to the collector electrode lead 21 completing the circuit between said source and the heat pump means 22. If desired, the casing 19 may be filled with a suitable insulating material, for example, a resin which hardens to form a solid material without evolution of water or other volatile substances.

Thermoelement means 24 and 25 may be of any suitable material exhibiting a high Peltier coefficient, low thermal conductivity, and low electrical resistivity. More specifically, thermoelement means 24 and 25 may be of the materials disclosed in the copending application of Robert W. Fritts and Sebastian Karrer, Serial No. 512,436, filed June 6, 1955. Such materials are semi-metallic alloys or compositions which may be characterized as binary metallic compounds of slightly imperfect composition, i.e., containing beneficial impurities constituting departures from perfect stoichiometry by reason of an excess of one of the metals over the other and/or containing added beneficial impurity substances denominated hereinafter "promoters." Such semi-metallic compositions have semiconductor-like conductance, both electrical and thermal. Semi-metallic alloys or compositions also include mixtures of such binary metallic compounds, which may be denominated ternary metallic alloys or compositions. Certain of these alloys or compositions exhibit negative and certain exhibit positive electrical characteristics. It is preferred that one of the thermoelement means, for example, thermoelement means 24, exhibit negative electrical characteristics, and that the other thermoelement means, for example, thermoelement means 25, exhibit positive electrical characteristics, so that the heat pump means 22 is of the P-N type.

The type (positive or negative) of alloy or composition selected for thermoelement means 24 and 25 is dependent upon the direction of current flow through the elements. That is, current flow through a thermoelement which exhibits positive electrical characteristics causes heat to be pumped in the direction of current flow therethrough. Conversely, current flow through a thermoelement which exhibits negative electrical characteristics causes heat to be pumped in the direction opposite to the direction of current flow therethrough.

The negative thermoelement means may, for example, be formed of an alloy comprising lead and at least one member of the group tellurium, selenium and sulphur.

For example, a negative thermoelement of lead-selenium-tellurium composition could include a tellurium-selenium constituent in which the selenium is but a trace. In this case, such constituent should constitute from 35% to 38.05% by weight of the composition, the balance (61.95% to 65% by weight) being lead. At the other extreme where the tellurium-selenium constituent consists almost entirely of selenium with but a trace of tellurium, such constituent should comprise from 25% to 27.55% by weight of the final composition, the remainder (from 72.45% to 75% by weight) being lead. Between these two extremes, the selenium-tellurium constituent varies linearly with the ratio of selenium to tellurium (expressed in atomic percent) in the selenium-tellurium constituent.

The negative thermoelement may also be formed of an alloy of lead, selenium and sulphur. For example, a thermoelement of lead-selenium-sulphur composition could consist of a selenium-sulphur constituent in which the sulphur is but a trace. In this case, such constituent should constitute from 25% to 27.55% by weight of the composition, the balance (75% to 72.45% by weight) being lead. At the other extreme, where the selenium-sulphur constituent consists almost entirely of sulphur with but a trace of selenium, such constituent should comprise from 12.8% to 13.34% by weight of the final compoistion, the remainder (from 87.2% to 86.63% by weight) being lead. Between these two extremes the selenium-sulphur constituent varies linearly with the ratio of selenium to sulphur (expressed in atomic percent) in the selenium-sulphur constituent.

With regard to the aforementioned compositions, it will be observed that in each case there is an excess of lead over and above the amount thereof necessary for satisfying the stoichiometric proportions of the compound formed in the second constituent or constituents, i.e., the tellurium, selenium or sulphur. For example, the composition consisting substantially of lead and selenium can contain up to 10.4% lead by weight of the total composition over and above the 72.41% by weight lead stoichiometrically necessary for combination with selenium.

The electrical characteristics of the aforementioned semi-metallic alloys, desirable, for example, in thermoelements for heat pump applications can be markedly and advantageously altered in a reproducible manner by the addition thereto of controlled amounts of matter other than the constituents of the base composition. Such compositions may also be denominated "beneficial impurities" as distinguished from undesirable impurities. For convenience, these additions are hereinafter designated "promoters," since they tend to enhance the electrical characteristics desired for the particular application of the base compositions.

As has previously been observed, all of the aforedescribed base compositions exhibit negative Peltier E.M.F. and negative conductivity. By the addition of certain "promoters," such negative properties may be enhanced, while the polarity of the electrical properties of the base compositions may be reversed by the addition of certain other "promoters" to provide a semi-metallic composition having positive electrical characteristics, i.e., positive conductivity and Peltier E.M.F. As previously indicated, compositions having the aforementioned positive electrical characteristics are preferred for use as the thermo-element means 24, whereas it is preferred to utilize compositions having negative electrical characteristics for use as the thermoelement means 23.

The aforementioned copending application of Robert W. Fritts and Sebastian Karrer gives a complete description of the beneficial impurities, including both departures from perfect stoichiometry and promoters, which have been found to be effective for improvement of the electrical properties of semi-metallic thermoelectric elements for heat pump applications when added to the aforementioned base compositions in minor amounts. For example, up to a maximum of 6.9% by weight of beneficial impurity including 3.9% excess lead and 3.0% promoter for promoted compounds, and a maximum of 10.4% by weight of beneficial impurity for unpromoted compositions.

The proportions and ranges of the various constituents aforementioned and particularly the minimum limits of lead constituent in the compositions, must be regarded as critical if the composition is to have the electrical properties desired in thermoelectric heat pump elements. If the lead content is significantly less than the minimum amount indicated for any particular selenium-tellurium or selenium-sulphur proportion, the desired values of Peltier E.M.F. and resistivity will not be afforded and the significant electrical and mechanical properties will not be reproducible. On the other hand if the lead content for any composition appreciably exceeds the aforementioned maximum limits, the resulting composition is too metallic in nature to afford satisfactory electrical characteristics for the purposes of the present invention.

A positive thermoelement may also be formed of an alloy of lead and tellurium in which there is an excess of tellurium over and above the amount thereof necessary for satisfying the stoichiometric proportions of the compound lead-telluride. Such alloy or composition should consist essentially of lead and tellurium in which lead is present in the range of 58.0% to 61.8% by weight and the balance in range of 42.0% to 38.2% by weight tellurium. It will be observed that in this case there is an excess of tellurium over and above the amount thereof necessary for satisfying the stoichiometric proportions.

As has been previously observed, the tellurium rich base lead-tellurium compositions exhibit positive Peltier E.M.F. and positive conductivity. The electrical characteristics of this compound, desirable, for example, in thermoelements for heat pump applications, can be markedly and advantageously altered in a reproducible manner by the addition thereto of controlled amounts of matter other than the constituents of such base composition. Such matter may also be denominated "beneficial impurities" as distinguished from undesirable impurities. For convenience, the additions are hereinafter designated "promoters" since they tend to enhance the electrical characteristics desired for the particular application of the base compositions.

The aforementioned copending application of Robert W. Fritts and Sebastian Karrer gives a complete description of the beneficial impurities, including both departures from perfect stoichiometry and promoters, which have been found to be effective for improvement of electrical properties of semi-metallic thermoelectric elements for heat pump applications when added to the aforementioned tellurium rich base lead-tellurium compositions. For example, up to a maximum of 5.5% by weight of beneficial impurity including 4.9% excess tellurium and 0.60% promoter for promoted compounds and a maximum of 6.7% by weight of beneficial impurity for unpromoted compositions.

The proportions and ranges of the various constituents aforementioned and particularly the minimum limits of tellurium in the compositions, must be regarded as critical if the composition is to have the electrical properties desired in thermoelectric heat pump elements. If the tellurium content is significantly less than the minimum amount indicated, the desired values of Peltier E.M.F. and resistivity will not be afforded and the significant electrical and mechanical properties will not be reproducible. On the other hand, if the tellurium content appreciably exceeds the aforementioned maximum limits, the resulting composition will not afford satisfactory electrical characteristics for the purposes of the present invention.

Not only are the proportions and ranges aforedescribed considered to be critical, but so also is the purity. More specifically, the limit of tolerable metallic impurity in the final composition has been found to be on the order of 0.01%, and the composition must be substantially oxygen free, if the mechanical and electrical properties desired are to be obtained and are to be reproducible. In the case of promoted compositions, however, the limit of tolerable impurity is 0.001%.

In the normal operation of the electrical device 10, the base, emitter, and collector electrode leads 17, 18, and 21 are connected into a suitable circuit (not shown), and as a result of current flow through the transistor 11, heat is generated therein, the greater portion of the heat generated appearing in the vicinity of the rectifying barrier or P–N junction associated with the collector electrode 14. This heat is conducted to the thermojunction member 25.

The heat pump 22 is energized by current flowing from the positive terminal of the D.C. source through conductor 28, member 26, thermoelement means 23, thermojunction member 25, thermoelement means 24, casing member 19, cover member 20, lead 21, and back to the negative terminal of the source through conductor 29. By virtue of the negative conductivity characteritsic of the thermoelement means 23 and the positive conductivity characteristic of the thermoelement means 24, the Peltier effect created by current flow through each of said thermoelement means in the direction stated causes thermal energy generated in the transistor 11 and flowing through the thermojunction member 25 to be absorbed at the thermojunctions 57 and 58 and to be simultaneously emitted at thermojunctions 56 and 59. Heat energy absorbed at the thermojunctions 57 and 58 by virtue of the Peltier effect is converted at said thermojunctions to electrical energy, and this electrical energy is instantaneously transferred to the thermojunctions 56 and 59, respectively, at which it is reconverted to heat which flows through and is dissipated from conductive casing members 19, 20 and 26 by radiation, by convection and by conduction to associated heat radiating structure (not shown), for example, to a chassis or the like on which the device 10 is mounted.

The Peltier heat pump means 22 affords highly efficient removal of heat from the transistor 11 to heat dissipating means, for example, the casing 19 and member 26. The rate of this heat removal is far greater, for example, than is possible by simple conduction down a temperature gradient. This improved heat removal permits the transistor to be operated at high power dissipation without the danger of overheating and resultant deterioration of its electrical characteristics. Where power operation is not an objective, the heat pump means 22 effectively reduces the operating temperature of the transistor to below ambient, effectively refrigerating the same to thereby improve its performance.

As will be understood by those skilled in the art, the rate of Peltier heat absorption at thermojunctions 57 and 58 and the rate of Peltier heat emission of thermojunctions 56 and 59 depend upon the temperatures of the respective thermojunctions, and said rates are linearly dependent upon the electric current flow through the circuit. The transfer of heat by this process is accomplished by the expenditure of electrical energy from the current source in the external circuit. The operating current in the heat pump circuit is, of course, chosen so that the Peltier effect absorption is greater than the joule heating within the pumping elements themselves.

Figure 2:
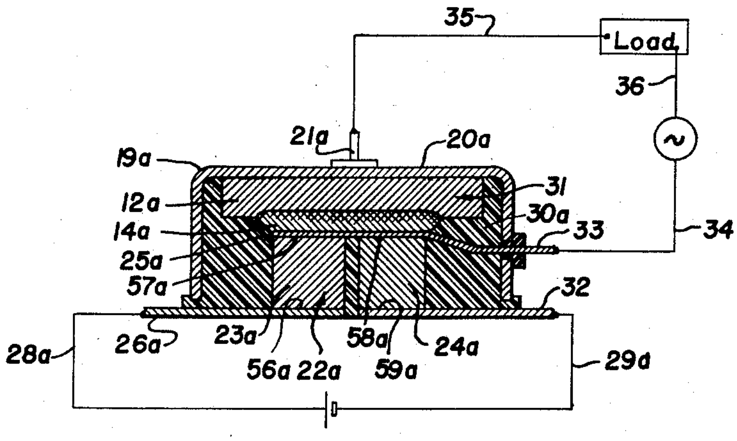
Figure 2 is a sectional view of a thermoelectrically cooled junction type rectifier constructed in accordance with the teachings of the invention.

Referring now to Figure 2 of the drawings, an electrical device 10*a* is illustrated therein which takes the form of a junction type semiconductor rectifier 31 comprising a crystal or body 12*a* of semiconductor material of one type of conductivity having a zone of opposite type conductivity material 14*a* separated therefrom by a rectifying barrier to provide a P–N junction. As in the case of the transistor, the operating characteristics of the rectifier 31 vary with temperature, and means is provided in Figure 2 for maintaining the temperature of the rectifier within predetermined limits. To this end, the rectifier 31 is provided with Peltier heat pump means 22*a* comprising semi-metallic thermoelement means 23*a* of, for example, negative conductivity, and semi-metallic thermoelement means 24*a* of positive conductivity, said thermoelement means preferably being of the same material as thermoelement means 23 and 24, respectively, of Figure 1.

The thermoelement means 23*a* and 24*a* are each bonded to a thermojunction member 25*a* of copper or other similar material, to form thermojunctions 57*a* and 58*a* respectively, and the member 25*a*, in turn, is bonded in good heat conducting ohmic contact to the zone 14*a* of the body 12*a*. The outer ends of the thermoelements 23*a* and 24*a* are bonded respectively to heat conductive thermojunction members 26*a* and 32 to form thermojunctions 56*a* and 59*a* respectively. The members 26*a* and 32 may be semi-circular in shape and are preferably made of metal having good electrical as well as heat conducting properties, said members comprising a cover for a cup-shaped metallic casing member 19*a* having an end wall 20*a* bonded in ohmic contact with the surface of the crystal 12*a* opposite the zone 14*a* as shown. Casing member 19*a* and members 26*a* and 32 comprise enclosure means which may be filled with insulating material 30*a* similar to the material 30 of Figure 1, said material insulating the members 26*a* and 32 from said casing member and from each other as shown. The thermojunction member 25*a* may be provided with a terminal lug 33 insulatably extending through a suitable aperture in the casing 19*a* as shown. The casing member 19*a* may also be provided with a terminal 21*a* which, with the lug 33, affords means for connecting the rectifier 31 into an external circuit. For example, the lug 33 may be connected in circuit with one side of an alternating source by a conductor 34, and the terminal 21*a* may be connected in circuit with one side of a load by a conductor 35. The other side of the load may be connected in circuit with the alternating current source by means of a conductor 36 as shown.

Means is also provided for energizing the heat pump means 22*a* from a direct current source. More specifically, the member 26*a* is connected in circuit with the positive terminal of a direct current source by means of a conductor 28*a*, and the member 32 is connected in circuit with the negative terminal of said source by a conductor 29*a*.

In the normal operation of the rectifier 31, heat is generated at the P-N junction thereof, and unless this heat is removed to prevent a substantial increase in temperature of the body 12*a*, the rectifying properties thereof are deleteriously affected and may be completely destroyed. To prevent such overheating and maintain the temperature of the body 12*a* within predetermined relatively low maximum limits, the heat pump means 22*a* is energized by current flow from the positive terminal of the D.C. source, through conductor 28*a*, member 26*a*, thermoelement means 23*a*, member 25*a*, thermoelement means 24*a*, member 32, and conductor 29*a* back to the negative terminal of the D.C. source. Heat pump means 22*a*, when energized by current flow therethrough in the prescribed direction operates to receive heat generated at the P-N junction through the thermojunction member 25*a*, converting said heat to electrical energy at thermojunctions 57*a* and 58*a* for instantaneous transfer to thermojunctions 56*a* and 59*a*, respectively, at which said electrical energy is reconverted to heat for radiation, conduction or convection from the members 26*a* and 32. Additional heat is removed from the body 12*a* by conduction to the casing member 19*a* from which it is transferred by radiation, conduction or convection.

The aforedescribed operation of the improved electrical device 10*a* shown in Figure 2 affords removal of heat from the crystal body 12*a* and permits the rectifier 31 to operate under relatively heavy loads without danger of overheating. Where, however, power operation is not the objective, the improved device 10*a* operates in a manner to effectively reduce the operating temperature of the rectifier 31 to below ambient, to thereby afford improved rectification characteristics.

Figure 3:
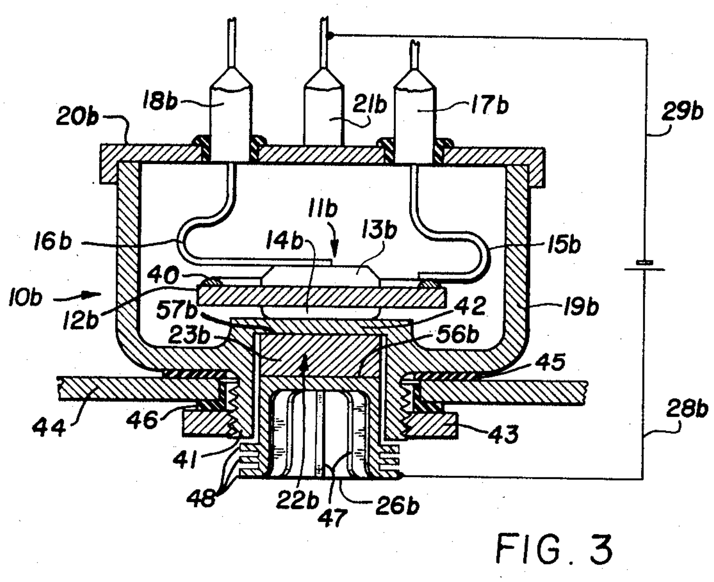
Figure 3 is a sectional view of another form of thermoelectrically cooled junction type transistor constructed in accordance with the teachings of the present invention.

Figure 3 illustrates another form of electrical device 10*b* constructed in accordance with the teachings of the present invention and comprising a transistor 11*b* enclosed within enclosure means in the form of a cup-shaped casing member 19*b* of metal having good electrical and heat conductive properties provided with a cover 20*b* having similar properties and electrically joined thereto. The transistor 11*b* shown in Figure 3 comprises a wafer-like crystal or body of semiconductor material, for example, germanium, of one conductivity type, for example, N-type, and having zones of opposite conductivity type in the form of an emitter electrode 13*b* and a collector electrode 14*b* separated by rectifying barriers each comprising a P-N junction. In the form of the invention shown in Figure 3, a nickel ring 40 is bonded in ohmic contact with the crystal or wafer 12*b* and affords reinforcement for the latter as well as functioning as a base electrode therefor. A base electrode lead 15*b* connects the ring 40 in circuit with a base electrode terminal 17*b* which insulatably extends through a suitable aperture in the cover member 20*b* as shown. An emitter lead 16*b* connects the emitter electrode 13*b* in circuit with an emitter electrode terminal 18*b* which insulatably projects through the cover member 20*b* as shown.

The casing member 19*b* is formed with an externally threaded tubular mounting stud 41 affording a socket, the inner end of which is defined by a wall portion 42. The stud 41 is adapted to threadably receive a nut 43 for securing the device 10*b* to a chassis shown fragmentarily at 44, with the stud 41 extending through a suitable aperture in said chassis and insulated therefrom, for example, by an insulating washer 45 and a flanged insulating bushing 46. The collector electrode 14*b* of the transistor 11*b* is bonded in ohmic contact with the inner surface of the wall portion 42 of the casing member 19*b* such that the casing member 19*b* and cover 20*b* form part of the collector electrode circuit, the cover 20*b* being provided with a collector electrode terminal 21*b*.

Disposed within the socket afforded by the tubular stud 41 is Peltier heat pump means 22*b* comprising semi-metallic thermoelement means 23*b* made, for example, of the same negative conductivity type material as the element 23 shown in Figure 1. Thermoelement means 23*b* is preferably bonded to the outer surface of the wall portion 42 to form therewith a thermojunction 57*b*. Thermoelement means 23*b* may be cylindrical, and the outer end wall thereof preferably is bonded to a generally cup-shaped contact and heat transfer member 26*b* to form therewith a thermojunction 56*b*. As shown in Figure 3, the member 26*b* projects axially beyond the end of the mounting stud 41 and is provided with internal heat transfer fins 47, as well as external heat transfer fins 48. Energization of the heat pump means 22*b* is afforded by current from a D.C. source, the positive terminal of which is connected in circuit with the member 26*b* by means of a conductor 28*b* when thermoelement 22*b* is formed of N-type material, and the negative terminal of said source is connected in circuit with the collector terminal 21*b* by means of a conductor 29*b*.

In the normal operation of the electrical device 10*b* heat is generated within the crystal 12*b*, the major portion of which being generated at the rectifying barrier adjacent the collector electrode 14*b*. This heat is received by the wall portion 42 of the casing member 19*b* and flows radially outwardly for radiation, conduction or convection from said casing member and also flows axially along the mounting stud 41 to the nut 43 for radiation, convection or conduction from said stud and nut. In addition to removal of heat in this manner, the improved device 10*b* affords much more effective removal of heat from the transistor 11*b* through operation of the heat pump means 22*b*. Heat pump means 22*b* is energized by current flow from the positive terminal of the D.C. source through conductor **28*b*, member 26*b*, thermoelement means 23*b*, casing members 19*b* and 20*b*, terminal 21*b*, and conductor 29*b*** back to the negative terminal of the source.

In response to current flow therethrough from the D.C. source in the prescribed direction, heat pump means **22*b* converts heat received by the casing wall portion 42 to electrical energy at the thermojunction 57*b*. This electrical energy is instantaneously transferred to the thermojunction 56*b* at which said electrical energy is reconverted to heat which flows to the heat transfer fins 47 and 48 of the member 26*b* and is released therefrom by convection or radiation. The temperature of the crystal 12*b*** is thus maintained below predetermined safe operating limits to afford the advantages aforestated with respect to the form of the device shown in Figure 1. The arrangement shown in Figure 3 is particularly useful for high power operation by virtue of the substantially improved heat removal afforded by the combination of the heat pump with heat dissipation means.

Figure 4:
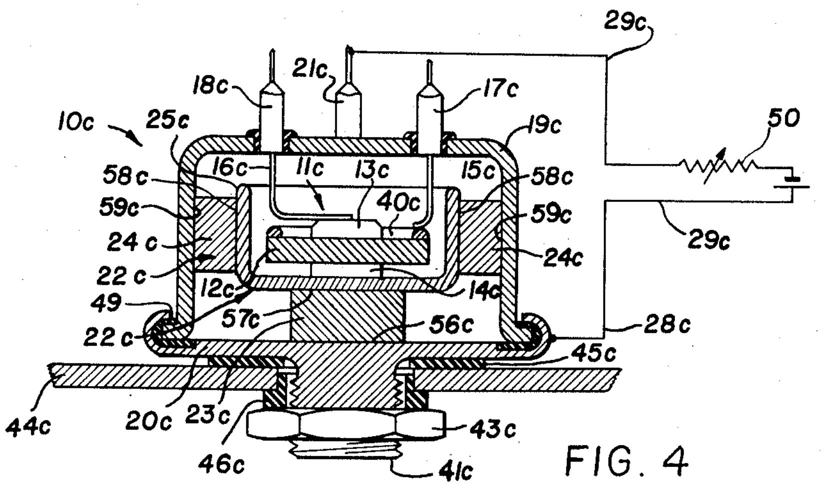
Figure 4 is still another form of thermoelectrically cooled junction type transistor constructed in accordance with the teachings of the present invention.

Figure 4 illustrates another form of electrical device **10*c* constructed in accordance with the teachings of the present invention and comprising a transistor 11*c* enclosed within enclosure means including metallic cup-shaped casing and cover members 19*c* and 20*c* fixed together in insulated relation, for example, by overlapping peripheral flanges separated by an insulating gasket 49 as shown. The members 19*c* and 20*c* preferably have good electrical and heat conductive characteristics. The cover 20*c* is provided with a mounting stud 41*c*, and the device 10*c* is mounted on a chassis 44*c* in a manner similar to that in which the device 10*b* is mounted on chassis 44 in Figure 3. The transistor 11*c* may be similar to the transistor 11*b*** shown in Figure 3, corresponding parts thereof being indicated by the same reference characters bearing the suffix "*c*."

Electrical device **10*c* is provided with a cup-shaped thermojunction member 25*c* of metal having good electrical and heat conducting properties, said member affording an inner receptacle for the transistor 11*c* as shown. The inner surface of the base of the member 25*c* is bonded in ohmic contact with the collector electrode 14*c* and forms part of the collector circuit for the transistor 11*c*. The cup-shaped thermojunction member 25*c* is substantially coaxial with the casing members 19*c* and 20*c*, and interposed between the cylindrical side wall of the member 25*c* and casing member 19*c* is annular thermoelement means 24*c* preferably bonded on its inner surface to the outer surface of the member 25*c* to form an annular thermojunction 58*c* therewith, and preferably bonded on its annular outer surface to the inner surface of the casing member 19*c* to form an annular thermojunction 59*c* therewith. Interposed between the base of the cup-shaped member 25*c* and the cover 20*c* is thermoelement means 23*c* which is preferably bonded to the member 25*c* to form a thermojunction 57*c* therewith, and is also preferably bonded to the cover of member 20*c* to form a thermojunction 56*c* therewith. The thermoelement means 23*c* and 24*c* are preferably of semi-metallic composition of negative and positive conductivity type, respectively, and more specifically may be made of the same compositions as the thermoelement means 23 and 24**, respectively, of Figure 1.

In the device **10*c*, the collector circuit includes the collector electrode 14*c*, the thermojunction member 25*c*, thermoelement means 24*c*, casing member 19*c* and collector terminal 21*c* integral with casing member 19*c*. Current from a D.C. source is supplied to the Peltier heat pump means 22*c* comprising thermoelement means 23*c* and 24*c* and thermojunction member 25*c* through a conductor 28*c* connecting the cover member 20*c* in circuit with the positive terminal of said source, and a conductor 29*c* connecting collector terminal 21*c* in circuit with the negative terminal of said source. The conductor 29*c* may have interposed therein a variable resistance 50 for adjustment of the amount of direct current flowing to the heat pump means 22*c*** and thereby the rate at which heat is pumped thereby.

In normal operation of the device **10*c*, heat is generated within the transistor 11*c* primarily adjacent the collector electrode 14*c*, and such heat is received by the thermojunction member 25*c*. In response to current flow from the positive terminal of the D.C. source through the heat pump means 22*c* and back to the negative terminal of said source, the heat received by the thermojunction member 25*c* is converted to electrical energy at the thermojunctions 57*c* and 58*c*. This electrical energy flows instantaneously through the respective thermoelements 23*c* and 24*c* axially toward thermojunction 56*c* and radially toward thermojunction 59*c* and is reconverted to heat at said thermojunctions. The heat received by the cover 20*c* is dissipated by radiation and convection therefrom and from the stud 41*c* and nut 43*c*, and is also dissipated by conduction through the washer 45*c* to the chassis 44*c*. The heat received by the casing member 19*c*** is transferred therefrom by convection and radiation.

The structure shown in Figure 4 is adaptable to high, low or intermediate power operation. The Peltier heat pump means **22*c* affords improved heat removal permitting high power operation, and when the device is operated at low power values, said heat pump means affords refrigeration of the thermojunctions 57*c* and 58 to below ambient temperatures to provide substantially increased efficiency in the operation of the transistor 11*c***.

Figure 5:
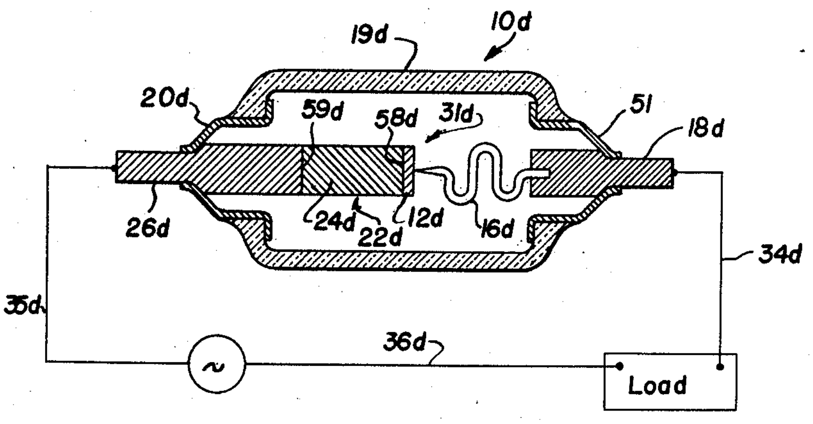
Figure 5 is a sectional view of a thermoelectrically cooled point contact type of rectifier constructed in accordance with the teachings of the present invention.

Figure 5 illustrates another form of electrical device **10*d* constructed in accordance with the teachings of the present invention and includes a point contact type of rectifier 31*d*. The rectifier 31*d* comprises a body or wafer of crystalline material 12*d* which may be a semiconductor material such as N-type germanium and has a point contact member 16*d* of a rare metal, for example, tungsten. Enclosure means is provided for the rectifier 31*d*, in the form of a sealed envelope of heat conducting material comprising a tubular body portion of electrically insulating material, for example, glass, sealed at its opposite ends to metallic cap members 20*d* and 51 which, in turn, sealingly carry terminal members 26*d* and 18*d* respectively projecting through openings therefor in said caps. The point contact member 16*d* of the rectifier 31*d* is carried by the inner end of the terminal member 18*d* as shown and is in electrical circuit therewith. Interposed between the inner end of the terminal member 26*d* and the semiconductor body 12*d* and joined in ohmic contact with said terminal and body to form thermojunctions 59 and 58, respectively therewith, is thermoelement means in the form of a body 24*d* of positive conductivity type semi-metallic material which may be the same as the material used in thermoelement means 24 of Figure 1. The terminal 18*d* may be connected with one side of the load circuit by means of a conductor 34*d*, and the terminal 26*d* may be connected in circuit with one side of an alternating source by means of a conductor 35*d*. The opposite side of the alternating current source and the opposite side of the load circuit may be connected in circuit with each other by means of a conductor 36*d***.

In the operation of the improved electrical device **10*d*, electrical current flows from the alternating current source through the circuit including conductor 35*d*, terminal 26*d*, thermoelement means 24*d*, crystal or wafer 12*d*, point contact member 16*d*, terminal member 18*d*, conductor 34*d*, the load circuit, and conductor 36*d*. This current flow causes heat to be generated at the point of contact of the contact member 16*d* with the body 12*d*, causing melting of the contacting portions of said body and contact member to form an alloy or composition having a conductivity type opposite that of the body 12*d* and separated therefrom by a rectifying barrier or P-N junction. Once this rectifying barrier is established, current can flow through the device 10***d*, and hence in the aforedescribed circuit, in one direction only. In the device 10*d* wherein the crystal or body 12*d* is of N-type germanium, the current flow through the rectifier 31*d* is from right to left as viewed in Figure 5.

Heat continues to be generated at the P–N junction of the rectifier 31*d* as a result of current flow therethrough, and this current, of course, also flows through the thermoelement means 23*d*. When the unidirectional current flows through the thermoelement means 23*d* in the direction indicated, heat from the crystalline body 12*d* is converted at the thermojunction 58*d* to electrical energy and is instantaneously transferred as such through the body 24*d* to the thermojunction 59*d*. At thermojunction 59*d* this electrical energy is reconverted to heat which is received by the terminal member 26*d* and conducted therefrom to the end cap 20*d* and enclosure body portion 19*d* for conduction, convection or radiation therefrom.

This action affords removal of heat from the rectifier 31*d*, in permitting the latter to operate at substantially increased loads without overheating. It will be observed that the improved electrical device 10*d* requires only one source of electrical energy by virtue of the fact that the rectified alternating current flowing through the rectifier 31*d* also is utilized to energize the heat pump means 22*d*.

Figure 6:
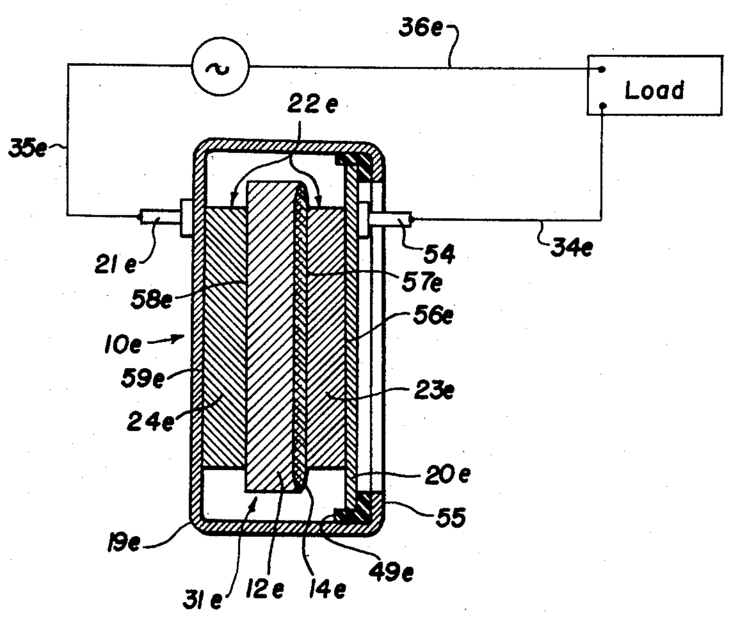
Figure 6 is a sectional view of still another form of thermoelectrically cooled junction type rectifier constructed in accordance with the teachings of the present invention.

Referring now to Figure 6, the electrical device 10*e* illustrated therein comprises a rectifier 31*e* of the junction type having a body or crystal 12*e* of semiconductor material of one conductivity type, for example, N-type germanium, having on one side thereof a zone 14*e* of the opposite conductivity type separated by a rectifying barrier or P–N junction. The rectifier 31*e* is provided with enclosure means comprising a generally cup-shaped casing member 19*e* and a cover member 20*e*, both of which are of metal having good electrical and heat conducting properties. As shown, the cover 20*e* is held in position by an inturned annular flange 55 on member 19*e* acting through an insulating bushing 49*e* as shown.

Interposed between the zone 14*e* of the crystal 12*e* and cover 20*e* is thermoelement means 23*e* which is joined in ohmic contact with the cover 20*e* to form a thermojunction 56*e* and is joined in ohmic contact with the zone 14*e* of the crystal 12*e* to form a thermojunction 57*e*. Thermoelement means 23*e* preferably is of a conductivity type opposite that of the zone 14*e* and may be of the same negative conductivity type semi-metallic material as the thermoelement means 23 of Figure 1. Interposed between the crystal body 12*e* and the casing member 19*e* is thermoelement means 24*e* which is joined in ohmic contact with the body 12*e* to form a thermojunction 58*e*, and is joined in ohmic contact with the casing member 19*e* to form a thermojunction 59*e*. The thermoelement means 24*e* is preferably of a conductivity type opposite to that of the major portion of the crystal 12*e*, for example, the same positive conductivity semimetallic material as the thermoelement means 24 of Figure 1.

Cover 20*e* is provided with an electrical terminal 54, and the casing member 19*e* is provided with an electrical terminal 21*e* for connection of the device 10*e* into an electrical circuit. One side of an alternating current source may be connected in circuit with terminal 21*e* by means of a conductor 35*e*, and one side of the load circuit may be connected in circuit with the terminal 54 by means of a conductor 34*e*. The opposite side of the alternating current source and of the load circuit may be interconnected by means of a conductor 36*e*.

In the operation of the improved electrical device 10*e*, the P-N junction between the main portion of the crystal 12*e* and the zone 14*e* thereof permits current flow therethrough in one direction only, for example, from right to left, as shown in Figure 6. Thus, current from the alternating current source flows from the terminal 54 through cover 20*e*, thermoelement means 23*e*, crystal 12*e*, thermoelement means 24*e*, to the case 19*e*, and out through the terminal 21*e*. This current flow causes generation of heat at the P-N junction and also causes thermoelement means 23*e* to convert to electrical energy at the thermojunction 57*e* heat received from the P-N junction through zone 14*e*. This electritcal energy is instantaneously transferred to the thermojunction 56*e*, at which point it is reconverted to heat for transfer from the cover 20*e* by radiation and convection. Similarly, current flow through thermoelement means 24*e* as aforedescribed causes the latter to convert to electrical energy at thermojunction 58*e* heat received from the crystal body 12*e*. This electrical energy is instantaneously transferred to the thermojunction 59*e* at which it is reconverted to heat for transfer from casing member 19*e* by conduction, convection or radiation.

As with the previously described devices, the improved structure of Figure 6 embodies in an extremely compact unitary device means for thermoelectrically removing heat from the crystal 12*e*, which means permits operation of said device under heavier loads without danger of overheating. It will also be noted that as in the form of the invention shown in Figure 5, the device shown in Figure 6 utilizes a single source of current, this being possible by virtue of the fact that the current flowing through the rectifier 31*e* is utilized not only to energize the load circuit but also to energize the thermoelement means for effecting removal of heat from the area of the P-N junction.

The forms of the invention shown and described herein have been selected for the purpose of disclosure only and are not intended to define the limits or scope of the invention or to confine the invention to a particular use. Various changes in the disclosed structures may be made without departing from the spirit of the invention, and all of such changes are contemplated as may come within the scope of the appended claims.

What is claimed as the invention is:

1. An electrical device comprising, in combination, a body of crystalline material having temperature sensitive electrical operating characteristics, enclosure means for said body having a heat radiative portion and means for cooling said body comprising heat pump means within said enclosure means having a first portion disposed in heat conductive contact with said body and having a second portion in heat conducting relation with said radiative enclosure portion, said heat pump means being operable to receive heat energy at said first portion for transfer to said second portion and radiation from said radiative enclosure portion.

2. A semiconductor device comprising a body of semiconductor material having zones of different conductivity separated by a rectifying barrier at which heat is generated during normal operation, enclosure means having a heat radiative portion, and heat pump means within said enclosure means having an energy absorbing portion disposed in engagement with said body in close proximity to said barrier and having an energy emitting portion in engagement with said radiative enclosure portion, said means being operable to receive heat energy at said energy absorbing portion for transfer to said energy emitting portion and radiation from said radiative enclosure portion.

3. An electrical device comprising, in combination a body of crystalline material having temperature sensitive electrical operating characteristics, enclosure means for said body including heat radiative portions, and means for maintaining the temperature of said body at a predetermined level comprising thermoelectric heat pump means within said enclosure means including thermojunction means having an annular side wall and an end wall defining a cup-shaped portion affording a receptacle for said body, said end wall being in heat conducting engagement with said body, annular first thermoelement means having an inner surface portion joined to and surrounding the annular side wall of said thermojunction means and having an outer surface portion joined to a heat radiative portion of said enclosure means, and second thermoelement means having an inner surface portion joined to the end wall of said thermojunction means and an outer surface portion joined to a heat radiative portion of said enclosure means, said heat pump means being operable to receive heat energy from said body at said thermojunction means for transfer outwardly through said first and second thermoelement means to said radiative enclosure portions for radiation from the latter.

4. A semiconductor device comprising, in combination a body of semiconductor material having zones of different conductivity separated by a rectifying barrier at which heat is generated during normal operation, enclosure means for said body including heat radiative portions, and means for maintaining the temperature of said body at a predetermined level comprising thermoelectric heat pump means within said enclosure means including thermojunction means having an annular side wall and an end wall defining a cup-shaped portion affording a receptacle for said body, said end wall being in heat conducting engagement with said body in close proximity to said barrier, annular first thermoelement means having an inner surface portion joined to and surrounding the annular side wall of said thermojunction means and having an outer surface portion joined to a heat radiative portion of said enclosure means, and second thermoelement means having an inner surface portion joined to the end wall of said thermojunction means and an outer surface portion joined to a heat radiative portion of said enclosure means, said heat pump means being operable to receive heat energy from said body at said thermojunction means for transfer outwardly through said first and second thermoelement to said radiative enclosure portions for radiation from the latter.

5. An electrical device comprising, in combination a body of semiconductor material having zones of different conductivity separated by a rectifying barrier at which heat is generated during normal operation, enclosure means for said body including heat radiative portions, and means for maintaining the temperature of said body at a predetermined level comprising thermoelectric heat pump means within said enclosure means including thermojunction means having an annular side wall and an end wall defining a cup-shaped portion affording a receptacle for said body, said end wall being in heat conducting engagement with said body in close proximity to said barrier, annular first semi-metallic thermoelement means having an inner surface portion joined to a heat radiative portion of said enclosure means, and second semi-metallic thermoelement means of opposite polarity having an inner surface portion joined to the end wall of said thermojunction means and an outer surface portion joined to a heat radiative portion of said enclosure means, said heat pump means being operable to receive heat energy from said body at said thermojunction means for transfer outwardly through said first and second thermoelement means to said radiative enclosure portions for radiation from the latter.

6. An electrical device comprising, in combination, a body of crystalline material having temperature sensitive electrical operating characteristics and operable to generate heat during normal operation thereof, enclosure means for said body having first and second insulated heat conducting portions, said first enclosure portion being disposed in heat transfer relation with said body, and means for maintaining the temperature of said body at a predetermined level comprising heat pump means within said enclosure means having a first portion disposed in heat conductive contact with said body and having a second portion in heat conductive contact with said second enclosure portion, said heat pump means being operable to receive heat energy at said first portion for transfer to said second portion and emission from said second enclosure portion, heat from said body also being received by and emitted from said first enclosure portion.

7. An electrical device comprising in combination, a body of crystalline material having temperature sensitive electrical operating characteristics, enclosure means for said body having first and second insulated heat conducting portions, and means for maintaining the temperature of said body at a predetermined level comprising first thermoelement means within said enclosure means and interposed between said body and said first enclosure portion and having thermojunctions adjacent said body and said enclosure portion, and second thermoelement means within said enclosure means and interposed between said body and said second enclosure portion and having thermojunctions adjacent said body and said second enclosure portion, said thermoelement means being operable to receive heat energy at the thermojunctions adjacent said body for transfer to the thermojunctions adjacent said enclosure portions and emission from said enclosure portions.

8. An electrical device comprising in combination, a body of crystalline material having temperature sensitive electrical operating characteristics, enclosure means for said body having first and second insulated heat conducting portions, and means for maintaining the temperature of said body at a predetermined level comprising first thermoelement means of semi-metallic material of one conductivity type disposed within said enclosure means and interposed between said body and said first enclosure portion and having thermojunctions adjacent said body and said enclosure portion, and second thermoelement means of semi-metallic material of the opposite conductivity type disposed within said enclosure means and interposed between said body and said second enclosure portion and having thermojunctions adjacent said body and said second enclosure portion, said thermoelement means being operable to receive heat energy at the thermojunction adjacent said body for transfer to the thermojunctions adjacent said enclosure portions and emission from said enclosure portions.

9. An electrical device comprising in combination, a body of crystalline material having temperature sensitive electrical operating characteristics, enclosure means for said body having first and second insulated heat conducting portions, and means for maintaining the temperature of said body at a predetermined level comprising first thermoelement means disposed within said enclosure means and interposed between said body and said first enclosure portion and joined therewith to form thermojunctions adjacent said body and said enclosure portion, second thermoelement means disposed within said enclosure means and interposed between said body and said second enclosure portion and joined therewith to form thermojunctions adjacent said body and said second enclosure portion, said body being thereby connected in series circuit between said first and second thermoelement means, and connection means on said first and second enclosure portions for effecting electrical connection with a source of energizing current for said thermoelement means and said body, said thermoelement means when energized being operable to receive heat energy at the thermojunctions adjacent said body for transfer to the thermojunctions adjacent said enclosure portions and emission from said enclosure portions.

10. An electrical device comprising, in combination, a body of crystalline material having temperature sensitive electrical operating characteristics, and means for maintaining the temperature of said body at a predetermined level comprising heat pump means having heat absorbing and heat emitting thermojunction means, one of said thermojunction means being disposed in direct heat conducting engagement with said body, and an enclosure for both said body and said heat pump means having a heat conductive portion in heat conducting contact with the other of said thermojunction means.

11. A semiconductor device comprising in combination, a body of semiconductor material having a base zone of one conductivity type and a smaller zone of different conductivity type separated from said base zone by a rectifying barrier at which is generated the major portion of the heat produced by normal operation of said device, enclosure means for said body having a heat conductive portion, and thermoelectric heat pump means within said enclosure means having heat absorbing thermojunction means disposed in direct heat conducting contact with said smaller zone in close proximity to said major heat generating rectifying barrier and having heat emitting thermojunction means in direct heat conducting engagement with said heat conductive enclosure portion.

12. An electrical device comprising, a body of crystalline material having temperature sensitive electrical operating characteristics, a first electrical circuit to which said body is connected, and means for maintaining the temperature of said body at a predetermined level comprising heat pump means having heat absorbing thermojunction means disposed in direct heat conducting physical contact with said body and having heat emitting thermojunction means remote from said body, and an energizing circuit for said heat pump means affording current flow through said heat pump means independent of the current flow in said first circuit.

13. A semiconductor device comprising in combination a body of semiconductor material having a base zone of one conductivity type and having emitter and collector zones of different conductivity type separated from said base zone by rectifying barriers, means connecting said base, emitter and collector zones into an electrical circuit in which the collector current is of substantially greater magnitude than the emitter current, and thermoelectric heat pump means having heat absorbing thermojunction means disposed in direct heat conducting contact with said collector zone, said heat pump means being connected into said circuit in series with said collector zone to cause said collector current to energize said heat pump means.

14. A semiconductor device comprising in combination, a body of semiconductor material having a base zone of one conductivity type and having emitter and collector zones of different conductivity type separated from said base zone by rectifying barriers, means connecting said base, emitter and collector zones into an electrical circuit in which the collector current is of substantially greater magnitude than the emitter current such that the major portion of the heat produced by normal operation of said device is generated at the rectifying barrier separating said base and collector zone, thermoelectric heat pump means having heat absorbing thermojunction means disposed in heat transfer relation with said collector zone in close proximity to said major heat generating rectifying barrier, and an energizing circuit for said heat pump means affording current flow through said heat pump means independent of the current flow through said first mentioned circuit.

15. An electrical device comprising in combination, a body of crystalline material having temperature sensitive electrical operating characteristics, means defining an enclosure for said body having an externally exposed heat conducting portion, and thermoelectric heat pump means for maintaining the temperature of said body at a predetermined level comprising thermoelement means interposed between said body and said enclosure portion and having thermojunctions adjacent said body and said enclosure portion, said thermoelement means being operable to receive heat energy at the thermojunction adjacent said body for transfer to the thermojunction adjacent said enclosure portion and emission from said enclosure portion.

16. An electrical device comprising in combination, a body of crystalline material having temperature sensitive electrical operating characteristics, means defining an enclosure for said body having first and second externally exposed heat conducting portions electrically insulated from one another, and thermoelectric heat pump means for maintaining the temperature of said body at a predetermined level comprising first thermoelement means interposed between said body and said first enclosure portion and having thermojunctions adjacent said body and said enclosure portion, and second thermoelement means interposed between said body and said second enclosure portion and having thermojunctions adjacent said body and said second enclosure portion, said first and second thermoelement means being operable to receive heat energy at the thermojunctions thereof adjacent said body for transfer to the thermojunctions thereof adjacent said enclosure portion and emission from said enclosure portion.

17. A semiconductor device comprising in combination a body of semiconductor material having a base zone of one conductivity type and having at least two other zones of different conductivity types separated from said base zone by rectifying barriers, means connecting said base and other zones into an electrical circuit in which the current flow through the first of said other zones is of substantially greater magnitude than the current flow through any other of said other zones, and thermoelectric heat pump means having heat absorbing thermojunction means disposed in heat transfer relation with said first zone, said heat pump means being connected into said circuit in series with said first zone to cause the current flowing therethrough to energize said heat pump means.

References Cited in the file of this patent

UNITED STATES PATENTS

| | | |
|---|---|---|
| 2,749,716 | Lindenblad | June 12, 1956 |
| 2,758,146 | Lindenblad | Aug. 7, 1956 |
| 2,777,975 | Aigrain | Jan. 15, 1957 |

OTHER REFERENCES

Telkes, M.: "The Efficiency of Thermoelectric Generators," Journal of Applied Physics, vol. 18, No. 6, December 1947, pages 1116–1127.

Kaltetechnik, vol. 5, No. 6, June 1953, pages 150–157.